United States Patent
Lee et al.

(10) Patent No.: US 7,067,367 B2
(45) Date of Patent: Jun. 27, 2006

(54) METHOD FOR REDUCING POLY-DEPLETION DUE TO THICKNESS VARIATION IN A POLYSILICON LAYER IN DUAL GATE CMOS FABRICATION PROCESS

(75) Inventors: Chang Yeol Lee, Seoul (KR); Deuk Sung Choi, Kyoungki-do (KR)

(73) Assignee: Hynix Semiconductor Inc., Kyoungki-do (JP)

( * ) Notice: Subject to any disclaimer, the term of this patent is extended or adjusted under 35 U.S.C. 154(b) by 0 days.

(21) Appl. No.: 10/712,921

(22) Filed: Nov. 13, 2003

(65) Prior Publication Data

US 2004/0166623 A1    Aug. 26, 2004

(30) Foreign Application Priority Data

Feb. 20, 2003  (KR)  .................. 10-2003-0010704

(51) Int. Cl.
   *H01R 4/64*   (2006.01)
(52) U.S. Cl. ................... 438/199; 438/218
(58) Field of Classification Search ............... 438/199, 438/218, 223, 224, 227–232, 532
See application file for complete search history.

(56) References Cited

U.S. PATENT DOCUMENTS 6,573,575 B1 *  6/2003  Yamazaki ............... 257/392
6,800,512 B1 * 10/2004  Itonaga et al. .......... 438/154

* cited by examiner

*Primary Examiner*—Jack Chen
(74) *Attorney, Agent, or Firm*—Ladas & Parry LLP

(57) ABSTRACT

Disclosed is a method for reducing poly-depletion in a dual gate CMOS fabrication process. The method reduces the poly-depletion in a dual gate CMOS fabrication process by increasing the doping efficiency in a gate polysilicon film. In order to increase the doping efficiency, the method employs the following four technical principles. First, the doping efficiency is increased when the dose of N+ ion implantation is increased. Second, the doping efficiency is increased when the thickness of N+ polysilicon is reduced. Third, the increase of depletion caused by the reduction of the channel width is inhibited when the EFH is adjusted to be less than 0. Fourth, the overall doping efficiency is increased when each step of polysilicon deposition and ion implantation is divided into multiple steps.

2 Claims, 9 Drawing Sheets

METHOD FOR REDUCING POLY-DEPLETION DUE TO THICKNESS VARIATION IN A POLYSILICON LAYER IN DUAL GATE CMOS FABRICATION PROCESS

BACKGROUND OF THE INVENTION

1. Field of the Invention

The present invention relates to a method for fabricating a semiconductor device, and more particularly to a method for reducing poly-depletion in a dual gate CMOS fabrication process.

2. Description of the Prior Art

As generally known in the art, MOSFET gates are formed of polysilicon with properties required for a gate, such as high melting point, easy formation of a thin film, easy line patterning, stability in oxidizing atmosphere and planarization. Actually, polysilicon gates in a MOSFET contain dopants, such as phosphorus (P), arsenic (As) and boron (B), thereby realizing a low resistance.

Conventional CMOS devices form N+ polysilicon gates in both NMOS and PMOS regions. However, a buried channel is formed by the count doping in the PMOS region to adjust a proper threshold voltage, which may increase short channel effects resulting in the degradation of device performance.

In an attempt to overcome such drawbacks, a dual gate CMOS which forms an N+ polysilicon gate in the NMOS region and a P+ polysilicon gate in the PMOS region has recently been introduced.

The fabrication of a dual gate CMOS is a process employing N+ polysilicon for the NMOS gate and P+ polysilicon for the PMOS gate. The process generally comprises the steps of depositing an undoped amorphous silicon (a-Si) or an undoped polysilicon (poly-Si) as a gate material, selectively implanting an N+ ion and a P+ ion into the NMOS and PMOS gates, respectively, and performing a thermal diffusion to uniformly distribute dopants over the entire gate regions.

However, poly-depletion may occur during the conventional process of fabricating a dual gate CMOS due to ion-implantation with an insufficient dose or energy and incomplete thermal diffusion.

The poly-depletion may be caused due to insufficient doping within a polysilicon film. Part of a voltage applied to the gate for channel inversion is applied to the depletion region at the polysilicon bottom, which consequently increases a threshold voltage Vt and the thickness of a gate dielectric film while reducing an on current.

The level of depletion at the polysilicon bottom is highly dependent on the thickness of polysilicon. Accordingly, the threshold voltage Vt has a great variation over the entire wafer, which makes it difficult to manage the proper target of the threshold voltage Vt and causes the reduction of yield.

Doping efficiency, as an index showing the poly-depletion level, is indicated by a percentage of the inversion gate capacitance relative to the accumulation gate capacitance. Generally, appropriate doping efficiency is about 95%. Such appropriate doping efficiency can be maintained when suitable ion implantation conditions and thermal budget are secured.

The poly-depletion may further increase due to narrowing of the gate linewidth. In submicron devices having a gate length or width of less than 0.2 μm, poly-depletion caused by a short length and/or by a narrow width of gates is added to one-dimensional poly-depletion caused by a vertical electric field in gates, thereby generating a three-dimensional poly-depletion effect. The 3D poly-depletion effect caused by the reduction of the gate length or width is based on the following two mechanisms.

The first mechanism is that additional depletions occur at the gate sidewalls due to the fringing gate fields. The additional depletions at the gate sidewalls can be ignored when the gate is long. However, as the gate length is scaled down, the additional depletions increase and the average level of depletions in the entire channel also increases. Accordingly, doping efficiency is reduced as the gate length is shorter. (C. H. Choi, et al., IEEE Electron Device Letters, Vol. 23, No. 4, p. 224, 2002)

FIGS. 1a and 1b are views for explaining the poly-depletion effect depending on the gate linewidth, wherein drawing reference numeral "11" is provided for a silicon substrate, numeral "12" for a gate dielectric film, numerals "13a" and "13b" for polysilicon gates having different linewidths, numeral "14" for a depletion region and numeral "15" for a sidewall region with additional depletion which is caused by a fringing field.

As shown in the above drawings, sidewall depletions caused by the fringing gate fields are increased as the gate linewidth is reduced. Also, a narrow gate linewidth reduces the doping efficiency.

The second mechanism of the poly-depletion effect is that the reduction of channel width further increases the poly-depletion effect due to so-called TRISI-NWE (Trench Isolation Step-Induced-Narrow Width Effect) produced by STI (Shallow Trench Isolation). (Youngmin Kim, et al., IEEE Electron Device Letters, Vol. 23, No. 10, p. 600, 2002)

FIGS. 2a and 2b are views for explaining the poly-depletion effect depending on the channel width, wherein drawing reference numeral "21" is provided for a silicon substrate, numeral "22" for an STI oxide film, numerals "23a" and "23b" for channels and numeral "24" for a polysilicon film.

As shown in FIGS. 2a and 2b, the difference between the height of the STI oxide film 22 and that of the silicon substrate 21, i.e., EFH (Effective Fox Height; height of field oxide measured at the top of the silicon substrate), is generally a positive number. Accordingly, the polysilicon film 24 becomes relatively thicker in border portions (indicated by oblique lines in the drawings) where it adjoins both the STI oxide film 22 and the channel 23a or 23b, because of the conformal deposition property of polysilicon.

As the polysilicon film 24 is getting thicker, the poly-depletion effect is further increased at the bottom of the polysilicon film 24 (below the dotted lines in the drawings). As a result, the poly-depletion effect becomes more significant at the edges of the channel, which consequently reduces the channel width. The average level of poly-depletion over the channel is raised due to the increase of the sidewall depletion, resulting in the reduction of the doping efficiency.

The explained above are two representative mechanisms relating to the three dimensional poly-depletion effect. The increased poly-depletion effect increases the absolute value of the threshold voltage Vt and the variation of the threshold voltage Vt within the wafer. Therefore, as higher integration is pursued, it is required to reduce the poly-depletion effect for the management of a stable threshold voltage Vt.

Cell transistors used in FCMOS SRAM devices of less than 0.14 μm have channel length and width of less than 0.2 μm that may bring about serious three-dimensional poly-depletion. Management of a stable threshold voltage Vt for these transistors is of critical importance to a low voltage operation yield.

SUMMARY OF THE INVENTION

Accordingly, the present invention has been made to solve the above-mentioned problems occurring in the prior art, and one object of the present invention is to provide a method for reducing poly-depletion in a dual gate CMOS fabrication process, which can improve the device performance and product yield.

In order to accomplish the above object, there is provided a method for reducing poly-depletion in a dual gate CMOS fabrication process, the method comprising the steps of: forming an STI oxide film at proper sites of a silicon substrate having an NMOS forming region and a PMOS forming region; sequentially forming a gate dielectric film and a polysilicon film on the silicon substrate including the STI oxide film; selectively implanting an N-type impurity and a P-type impurity into the portions of the polysilicon film, which correspond respectively to the NMOS forming region and PMOS forming region of the silicon substrate, by ion implantation; and patterning the polysilicon film having the selectively ion-implanted N-type and P-type impurities and the gate dielectric film to form an N+ polysilicon gate in the NMOS region of the silicon substrate and a P+ polysilicon gate in the PMOS region of the silicon substrate, wherein the ion implantation of the N-type impurity is performed by implanting phosphorus in a dose of 1 to $2 \times 10^{16}/cm^2$.

The STI oxide film is formed higher than the surface of the silicon substrate. The polysilicon film has a thickness of 1900 to 2100 Å and is relatively thicker at the border portions where it adjoins the STI oxide film and the silicon substrate.

In order to accomplish the above object, there is also provided a method for reducing poly-depletion in a dual gate CMOS fabrication process, comprising the steps of: forming an STI oxide film at proper sites of a silicon substrate having an NMOS forming region and a PMOS forming region; sequentially forming a gate dielectric film and a polysilicon film on the silicon substrate including the STI oxide film; selectively implanting an N-type impurity and a P-type impurity into the portions of the polysilicon film, which correspond respectively to the NMOS forming region and PMOS forming region of the silicon substrate, by ion implantation; and patterning the polysilicon film having the selectively ion-implanted N-type and P-type impurities and the gate dielectric film to form an N+ polysilicon gate in the NMOS region of the silicon substrate and a P+ polysilicon gate in the PMOS region of the silicon substrate, wherein the polysilicon film has a thickness ranging from 1600 to 1800 Å.

In addition, there is provided a method for reducing poly-depletion in a dual gate CMOS fabrication process, comprising the steps of: forming an STI oxide film at proper sites of a silicon substrate having an NMOS forming region and a PMOS forming region; sequentially forming a gate dielectric film and a polysilicon film on the silicon substrate including the STI oxide film; selectively implanting an N-type impurity and a P-type impurity into the portions of the polysilicon film, which correspond respectively to the NMOS forming region and PMOS forming region of the silicon substrate, by ion implantation; and patterning the polysilicon film having the selectively ion-implanted N-type and P-type impurities and the gate dielectric film to form an N+ polysilicon gate in the NMOS region of the silicon substrate and a P+ polysilicon gate in the PMOS region of the silicon substrate, wherein the height of the STI oxide film measured at the top of the silicon substrate is less or equal to 0.

To adjust the height of the STI oxide film, a target polishing amount of CMP is increased when forming the STI oxide film. Alternatively, after formation of the STI oxide film, wet etching is performed to recess the surface of the STI oxide film.

In addition, there is provided a method for reducing poly-depletion in a dual gate CMOS fabrication process, comprising the steps of: forming an STI oxide film at proper sites of a silicon substrate having an NMOS forming region and a PMOS forming region; sequentially forming a gate dielectric film and a polysilicon film oh the silicon substrate including the STI oxide film; selectively implanting an N-type impurity and a P-type impurity into the portions of the polysilicon film, which correspond respectively to the NMOS forming region and PMOS forming region of the silicon substrate, by ion implantation; and patterning the polysilicon film having the selectively ion-implanted N-type and P-type impurities and the gate dielectric film to form an N+ polysilicon gate in the NMOS region of the silicon substrate and a P+ polysilicon gate in the PMOS region of the silicon substrate, wherein the formation of the polysilicon film and the ion-implantation of the impurities are repeated at least twice.

The polysilicon film is formed to have a final thickness ranging from 1900 to 2100 Å which is identical to the sum of the thicknesses obtained in every repeated formation of the polysilicon film.

The present invention can reduce poly-depletion by increasing the doping efficiency in the polysilicon film, thereby achieving improvement of the device performance and product yield.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
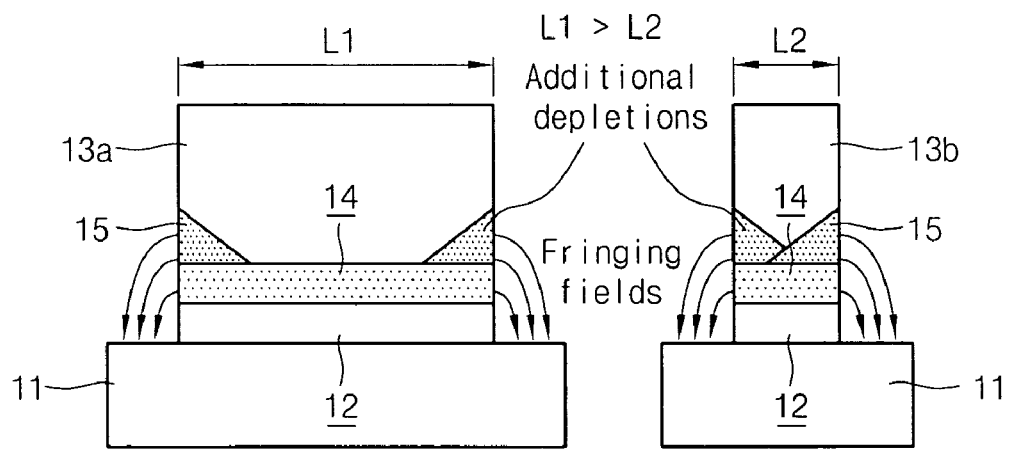
FIGS. 1a and 1b are views for explaining the poly-depletion effect depending on the gate linewidth.
Figure 1B:
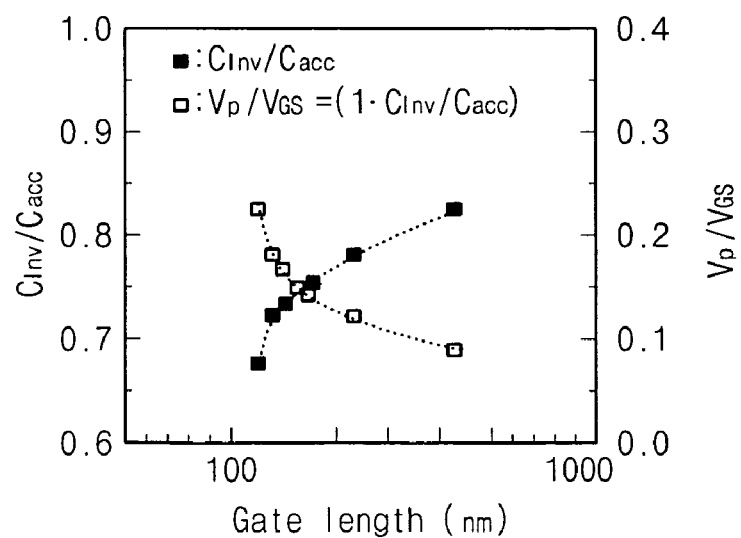
Figure 2A:
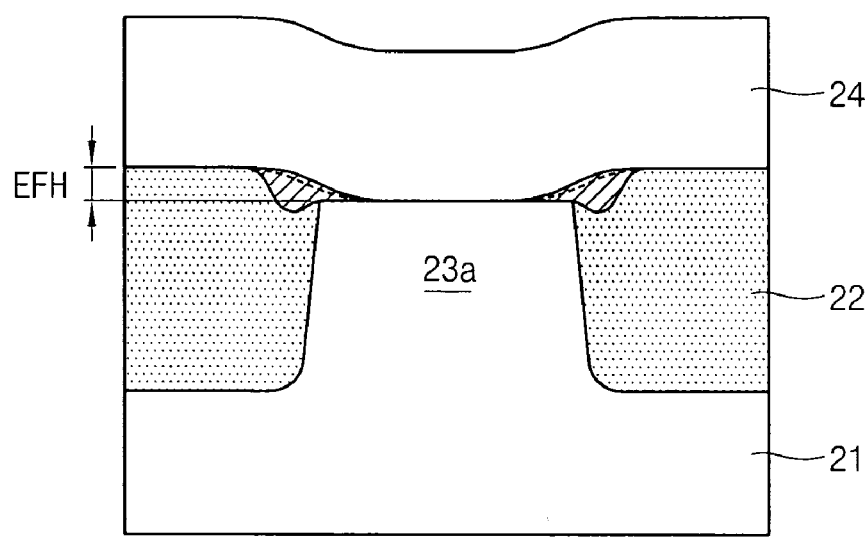
FIGS. 2a and 2b are views for explaining the poly-depletion effect depending on the channel width.
Figure 2B:
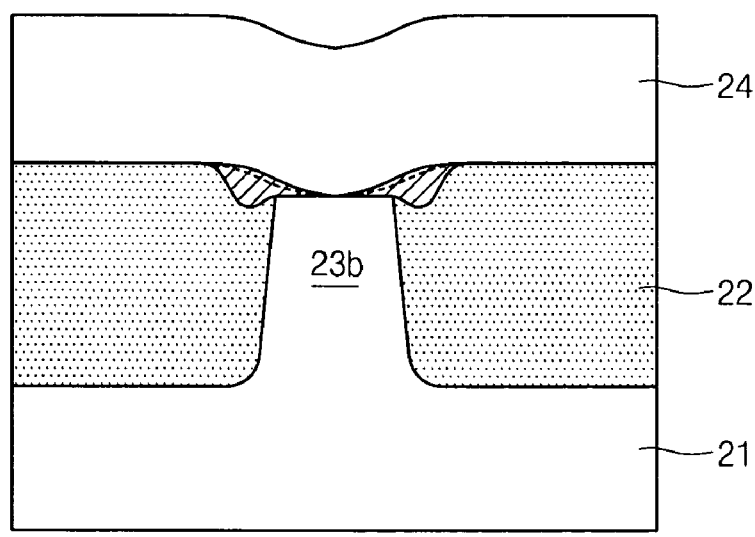

Hereinafter, preferred embodiments of the present invention will be described with reference to the accompanying drawings. In the following description and drawings, the same reference numerals are used to designate the same or similar components, and so repetition of the description on the same or similar components will be omitted.

The present invention is based on the following four technical principles to increase the doping efficiency. First, the doping efficiency is increased when the dose of N+ ion implantation is increased. Second, the doping efficiency is increased when the thickness of N+ polysilicon is reduced. Third, the increase of depletion caused by the reduction of the channel width is inhibited when the EFH is adjusted to be less than 0. Fourth, the overall doping efficiency is increased when each step of polysilicon deposition and ion implantation is divided into multiple steps.

Hereinafter, methods of reducing poly-depletion based on the above technical principles will be explained in more detail.

[First Embodiment]

FIGS. 3a to 3d are cross-sectional views showing a process of reducing poly-depletion according to the first embodiment of the present invention.

Figure 3A:
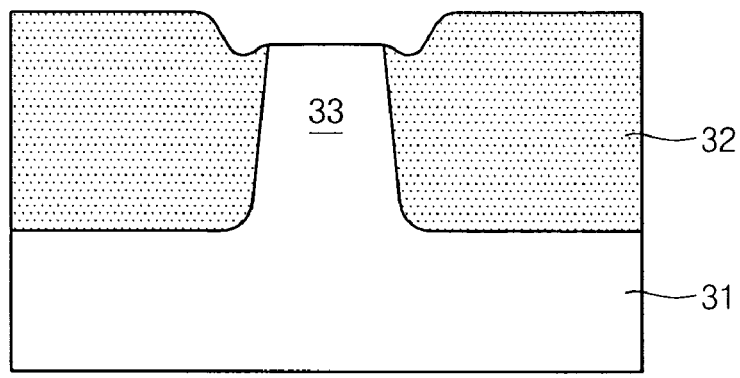
FIGS. 3a to 3d are cross-sectional views showing a process of reducing poly-depletion in accordance with a first embodiment of the present invention.

Referring to FIG. 3a, a silicon substrate 31 having NMOS and PMOS forming regions is provided. AN STI oxide film 32 is formed in the field regions of the silicon substrate 31 by a known STI process. Accordingly, an active region 33 where an NMOS and a PMOS will be formed is defined. The STI oxide film 32 is formed higher than the surface of the active region 33 of the silicon substrate 31.

Figure 3B:
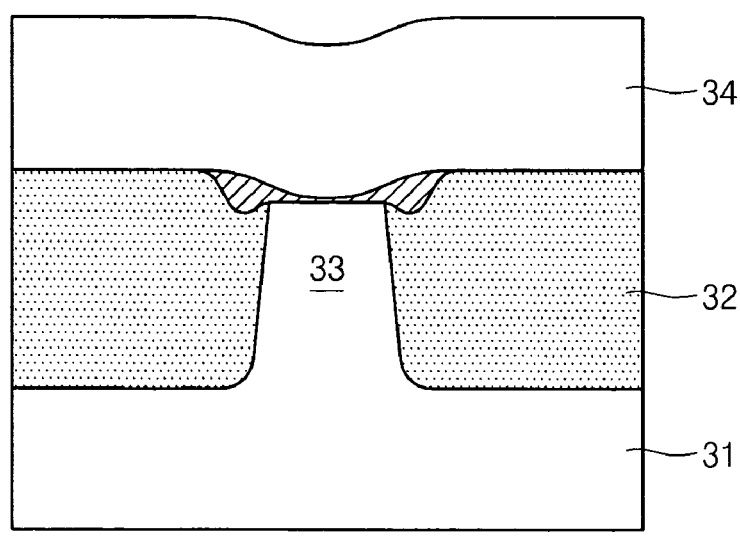

Referring to FIG. 3b, a gate dielectric film (not shown) is formed on the upper surface of the silicon substrate 31 including the STI oxide film 32. Subsequently, a gate polysilicon film 34 having a thickness of 1900 to 2100 Å, preferably 2000 Å, is deposited on the gate dielectric film. Because of a positive EFH between the surface of the STI oxide film 32 and that of the active region 33 of the silicon substrate 31, the polysilicon film 34 is deposited more thickly at the border portions (indicated by oblique lines) where it adjoins the STI oxide film 32 and the active region 33. Additional depletions may occur at such thicker portions of the polysilicon film due to the reduction of the channel width.

Figure 3C:
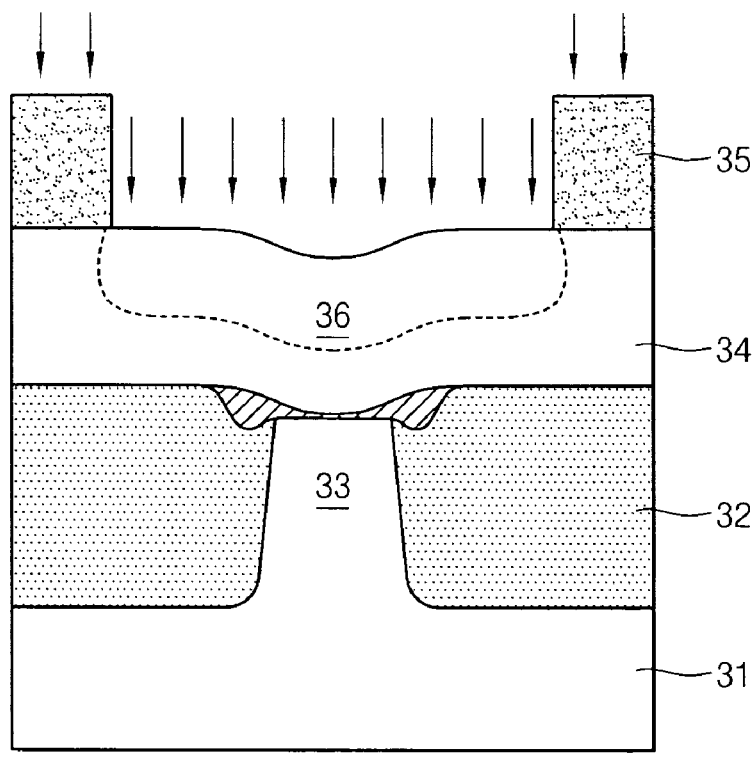

Referring to FIG. 3c, an N+ ion implantation mask 35 is formed on the polysilicon film 34 by a known process. Subsequently, an N-type impurity, preferably phosphorus, is ion-implanted into the region of the polysilicon film which is not covered by the N+ ion implantation mask 35. In the prior art, phosphorus is implanted in a dose of about $5 \times 10^{15}/cm^2$ (=5E15) for the N+ ion implantation. In the present invention, however, phosphorus is implanted in a dose of about 1 to $2 \times 10^{16}/cm^2$, preferably $1 \times 10^{16}/cm^2$ (=1E16). The higher dose inhibits the poly-depletion effect, thereby reducing a threshold voltage Vt variation and improving the yield.

Figure 3D:
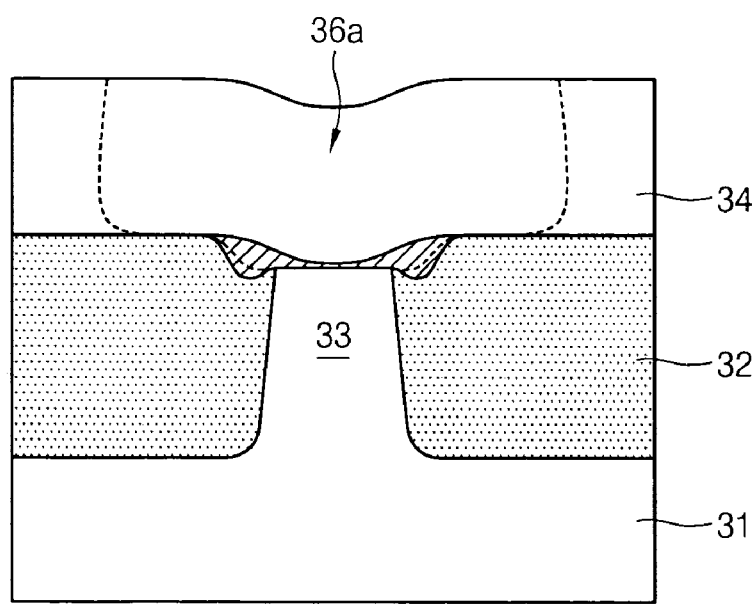

Referring to FIG. 3d, the resulting structure formed by the above processes is heated to a temperature higher than 800° C. for thermal diffusion of the ion-implanted impurities. At this time, the thermal diffusion occurs below the dotted line in the portion indicated by the oblique lines. This implies that the depletion at the gate sidewalls is reduced.

Figure 4:
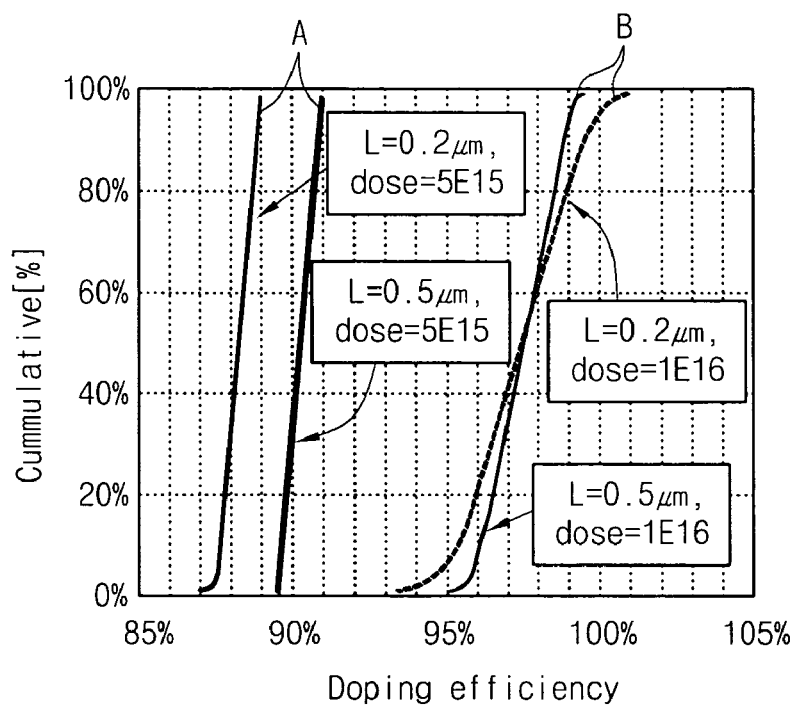
FIG. 4 is a graph showing the doping efficiency according to the dose of an ion-implanted impurity.

FIG. 4 is a graph showing the doping efficiency according to the dose of an ion-implanted N-type impurity, wherein "A" is a case that the N+ impurity has been ion-implanted in a dose of 5E15 and "B" is a case that the N+ impurity has been ion-implanted in a dose of 1E16.

The graph shows that ion-implantation of 1E16 dose further increases doping efficiency, compared to the ion-implantation of 5E15 dose. In other words, the prior art that implants 5E15 dose brings about an additional reduction of doping efficiency due to the reduction of the gate length. However, the present invention implanting 1E16 dose does not reduce the doping efficiency despite the reduction of the gate length.

Figure 5:
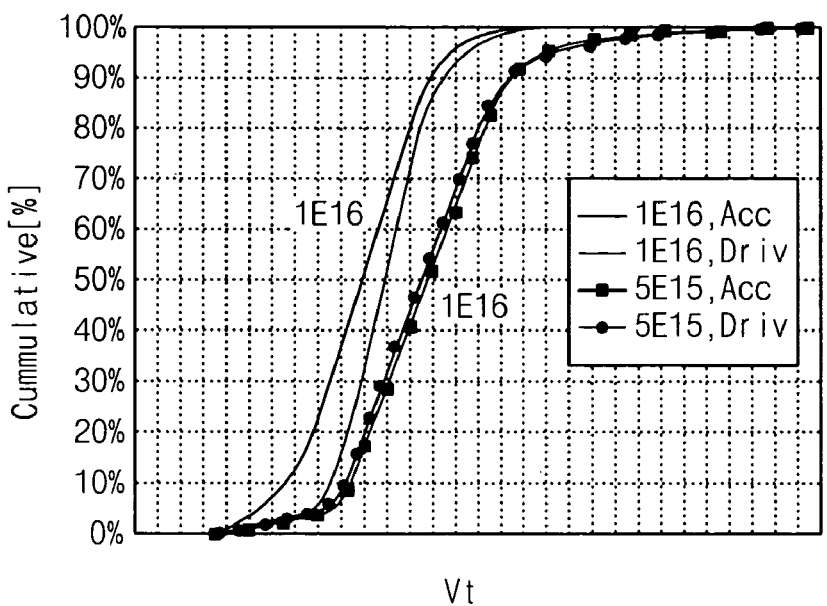
FIG. 5 is a graph showing the distribution of threshold voltages of access and driver transistors in a wafer according to the dose of a ion-implanted N-type impurity.

FIG. 5 is a graph showing the distribution of threshold voltages of access and driving transistors in a wafer according to the dose of an ion-implanted N-type impurity. These two transistors are both NMOS transistors having a gate length of less than 0.2 μm and a narrow gate width of about 0.2 μm, which can generate three-dimensional poly-depletion. The dose of 1E16 reduces the threshold voltage Vt variation, as compared to the dose of 5E15. Particularly, a tail that appears at a cumulative distribution above 90% is not detected in the case of 1E16 dose. This shows that the 1E16 dose can secure management of a stable threshold voltage Vt.

Also, when compared to the 5E15 dose, the 1E16 dose can improve the yield due to the reduction of the bit fail.

[Second Embodiment]

The second embodiment of the present invention reduces the thickness of the N+ polysilicon film to be smaller than that of the conventional polysilicon film, thereby increasing the doping efficiency in the N+ polysilicon film. More specifically, in the prior art, a gate polysilicon film is deposited in a thickness of 1900 to 2100 Å, preferably 2000 Å. However, the present invention deposits the gate polysilicon film in a reduced thickness of 1600 to 1800 Å.

Since the subsequent N+ ion implantation is performed in a relatively reduced thickness of the polysilicon film, the doping efficiency in the polysilicon film is increased to the contrary. Accordingly, the poly-depletion effect can be reduced.

[Third Embodiment]

Figure 6A:
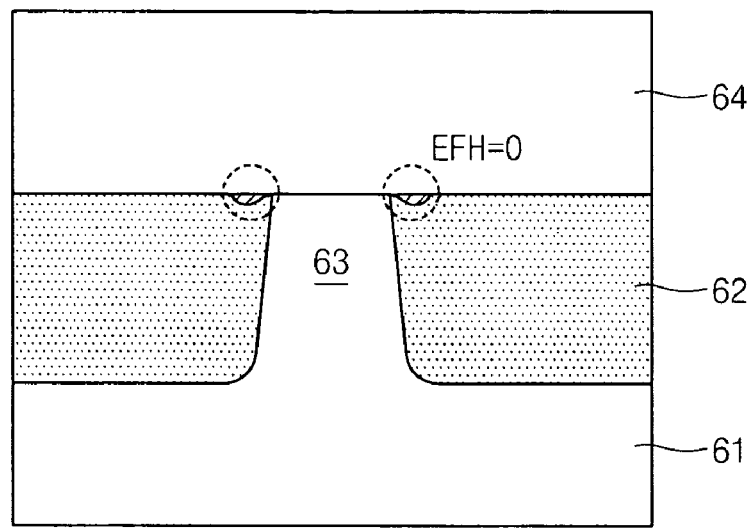
FIGS. 6a and 6b are cross-sectional views showing a process of reducing poly-depletion in accordance with a third embodiment of the present invention.
Figure 6B:
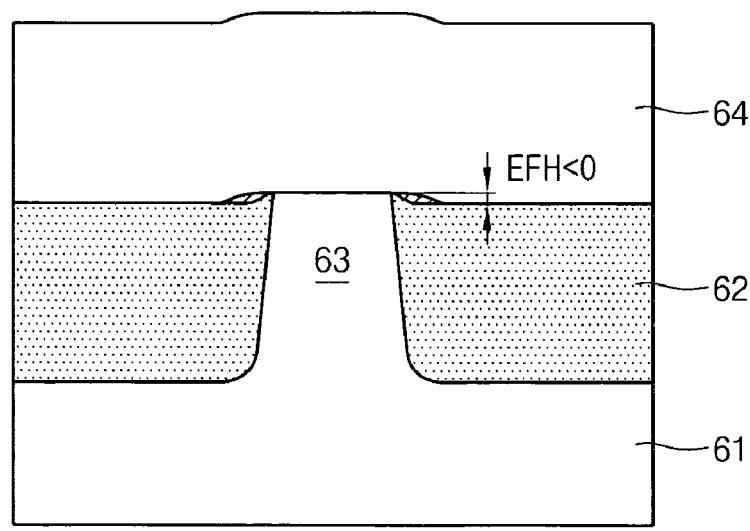

FIGS. 6a and 6b are cross-sectional views showing a process of reducing poly-depletion according to the third embodiment of the present invention, wherein drawing reference numeral "61" is provided for a silicon substrate, numeral "62" for an STI oxide film, numeral "63" for an active region and numeral "64" for a polysilicon film.

The third embodiment reduces poly-depletion by adjusting the EFH to be less than 0.

FIG. 6a shows a case that the EFH is 0. Since the thickened portion of the polysilicon film 64 is confined within an STI moat region, no additional depletion occurs at the channel edge region.

FIG. 6b shows a case that the EFH is less than 0. Since the polysilicon film 64 has thickened portions outside the channel due to its conformal deposition property, no additional poly-depletion occurs at the channel edge region.

In order to adjust the EFH to be less than 0, the target polishing amount of CMP (Chemical Mechanical Polishing), which is performed after gap filling to form the STI oxide film 62, is increased. Alternatively, wet etching is additionally performed prior to the formation of the gate dielectric film to recess the surface of the STI oxide film 62. If the EFH is excessively lowered, the threshold voltage will likely be reduced due to so-called INWE. Therefore, it is significant to determine a proper EFH.

[Fourth Embodiment]

According to the fourth embodiment, deposition of the polysilicon film and ion implantation are performed at least twice to increase doping efficiency and thereby reduce poly-depletion.

FIGS. 7a to 7e are cross-sectional views showing a process of reducing poly-depletion according to the fourth embodiment.

Figure 7A:
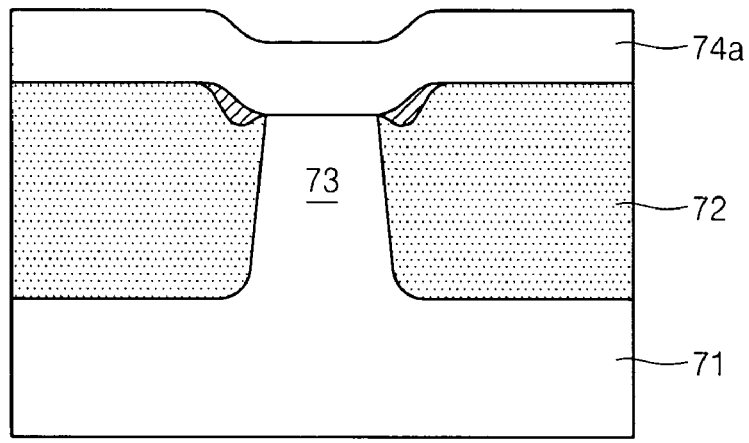
FIGS. 7a to 7e are cross-sectional views showing a process of reducing poly-depletion in accordance with a fourth embodiment of the present invention.

Referring to FIG. 7a, an STI oxide film 72 that defines an active region 73 is formed at the field regions of a silicon substrate 71 having NMOS and PMOS forming regions by a known process. Subsequently, a gate dielectric film (not shown) is formed on the silicon substrate 71 including the STI oxide film 72. A first polysilicon film 74a is deposited on the gate dielectric film. The thickness of the first polysilicon film 74a is half of the thickness of a whole gate polysilicon film which will finally be formed. For example, when the thickness of the finally formed gate polysilicon film is 1900 to 2100 Å, preferably 2000 Å, the first polysilicon film 74a should have a half thickness of 1000 Å. A reduced thickness of the polysilicon film will reduce the thickening at the channel edges.

Figure 7B:
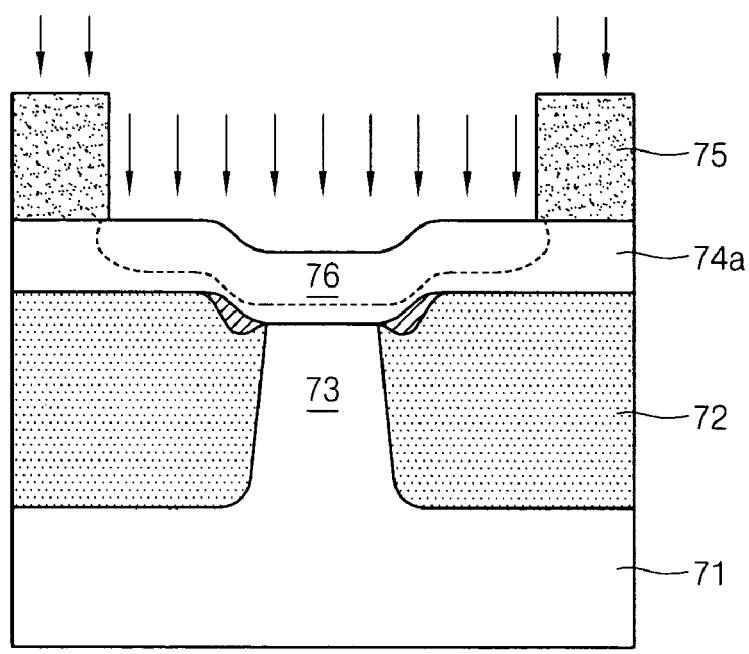

Referring to FIG. 7B, a first N+ ion implantation mask 75 is formed on the first polysilicon film 74a. Subsequently, an N-type impurity, preferably phosphorus, is ion-implanted into the portion of the polysilicon film which is not covered by the first N+ ion implantation mask 75. The drawing reference numeral "76" refers to the N+ ion implanted region. The dotted line is the boundary of the N+ ion implanted region.

During the phosphorus ion implantation, the ion implantation energy should be reduced to correspond to the reduced thickness of the polysilicon film. The reduction of the ion implantation energy reduces the vertical straggle, $\Delta Rp$. Accordingly, it is possible to obtain a more steep ion implantation profile. Since a larger dose can diffuse to the bottom of the polysilicon film in a subsequent thermal diffusion step, the overall doping efficiency can be increased.

Figure 7C:
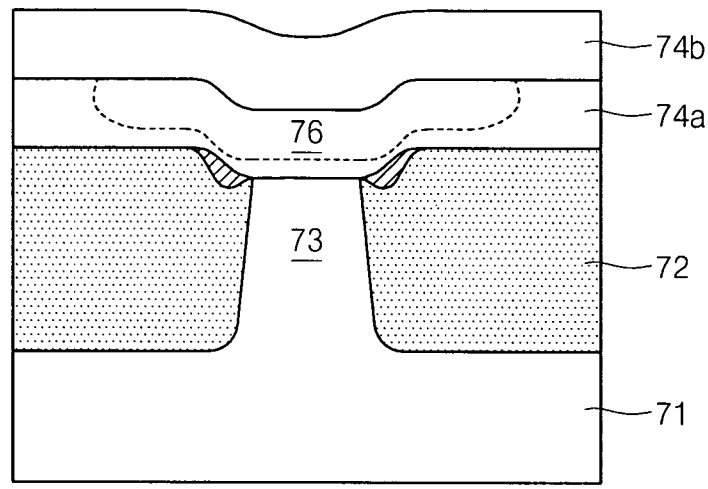

Referring to FIG. 7c, the first N+ ion implantation mask is removed. A second polysilicon film 74b is then deposited on the first polysilicon film 74a in a thickness calculated by subtracting the thickness of the first polysilicon film 74a from the desired thickness of the final polysilicon film. For example, the second polysilicon film 74b has a thickness of 1000 Å.

Figure 7D:
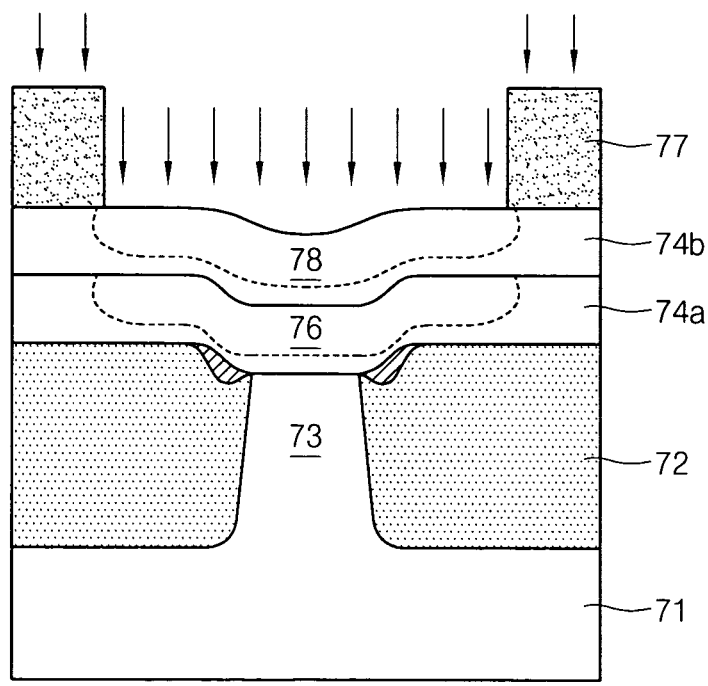

Referring to FIG. 7d, a second N+ ion implantation mask 77 is formed on the second polysilicon film 74b. Subsequently, phosphorus is ion-implanted into the portion of the second polysilicon film 74b which is not covered by the second N+ ion implantation mask 77, with energy corresponding to the reduced thickness of the second polysilicon film. The drawing reference numeral "78" refers to the N+ ion implanted region. The dotted line is the boundary of the N+ ion implanted region.

Figure 7E:
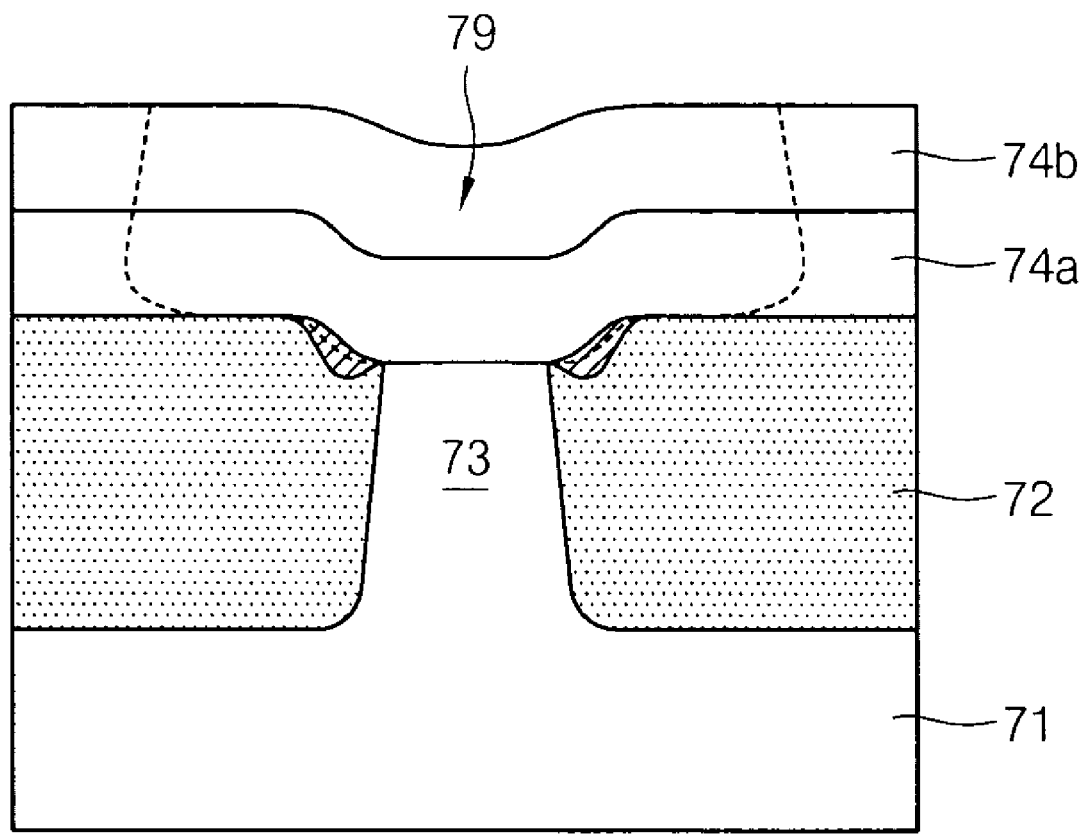

Referring to FIG. 7e, the second N+ ion implantation mask is removed. The resulting structure formed by the above processes is annealed for thermal diffusion of the dopants ion-implanted into the first and second polysilicon films 74a and 74b. At this time, depletion actually occurs below the dotted line in the portion indicated by the oblique lines. Also, the overall doping efficiency is increased within the first and second polysilicon films 74a and 74b.

As explained above, the present invention reduces poly-depletion by increasing the doping efficiency in a gate polysilicon film during the fabrication of a dual gate CMOS. In addition, the present invention can improve the device performance and increase the manufacturing yield.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for reducing poly-depletion in a dual gate CMOS fabrication process, comprising the steps of:
   forming an STI oxide film adjacent an active region having an NMOS forming region and a PMOS forming region in a silicon substrate,
   wherein the area above the boundary between the active region and the STI oxide film is referred to as the fringing portion,
   wherein the height of the STI oxide film not at or near the fringing portion (referred to as a non-fringing portion) is higher than the height of the STI oxide film at or near the fringing portion and the height of the active region;
   sequentially forming a gate dielectric film and a polysilicon film on the STI oxide film and the active region formed on the silicon substrate
   wherein the polysilicon film formed at or near the fringing portion is thicker than the non-fringing portion of the polysilicon film;
   selectively implanting an N-type impurity and a P-type impurity into the portions of the polysilicon film, which correspond respectively to the NMOS forming region and PMOS forming region of the silicon substrate, by ion implantation; and
   patterning the polysilicon film having the selectively ion-implanted N-type and P-type impurities and the gate dielectric film to form an N+ polysilicon gate in the NMOS region of the silicon substrate and a P+ polysilicon gate in the PMOS region of the silicon substrate,
   wherein the ion implantation of the N-type impurity is performed by implanting phosphorus in a dose of 1 to $2 \times 10^{16}/cm^2$,
   after the step of patterning the polysilicon film, heating at a temperature higher than 800 degree Celsius allowing thermal diffusion of the ion-implanted impurities into the bottom portion of the polysilicon film formed at the boundary between the active region and the STI oxide film.

2. The method according to claim 1, wherein said polysilicon film has a thickness ranging from 1900 to 2100 Å.

* * * * *